US010938315B2

(12) United States Patent
Endo et al.

(10) Patent No.: US 10,938,315 B2
(45) Date of Patent: Mar. 2, 2021

(54) CONTROL CIRCUIT FOR AC/DC CONVERTER

(71) Applicant: Fuji Electric Co., Ltd., Kanagawa (JP)

(72) Inventors: Yuta Endo, Nagano (JP); Kazuhiro Kawamura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 495 days.

(21) Appl. No.: 15/890,274

(22) Filed: Feb. 6, 2018

(65) Prior Publication Data

US 2018/0269800 A1 Sep. 20, 2018

(30) Foreign Application Priority Data

Mar. 16, 2017 (JP) .............................. JP2017-051039

(51) Int. Cl.
*H02M 7/02* (2006.01)
*G01R 31/40* (2020.01)
(Continued)

(52) U.S. Cl.
CPC .............. *H02M 7/02* (2013.01); *G01R 19/12* (2013.01); *G01R 19/155* (2013.01); *G01R 31/40* (2013.01);
(Continued)

(58) Field of Classification Search
CPC ........ H02M 7/02; H02M 1/32; H02M 1/4258; H02M 3/33507; H02M 1/126;
(Continued)

(56) References Cited

U.S. PATENT DOCUMENTS 9,537,417 B2 1/2017 Shiroyama et al.
9,837,917 B1 * 12/2017 Furtner ............. H02M 3/33523
(Continued)

FOREIGN PATENT DOCUMENTS

JP 2003-174704 A 6/2003
JP 2011-160629 A 8/2011
(Continued)

OTHER PUBLICATIONS

Abuzaki, Jun et al., "6th Generation PWM Controller IC: FA8A00 Series", Fuji Electric Journal, Fuji Electric Co., Ltd., 2012, vol. 85, No. 6, pp. 452-456 (Fig. 2) (Mentioned in paragraph Nos. 6, 26, 28, 33, 51, and 104 of the as-filed specification and English abstract included as a concise explanation of relevance.).
(Continued)

*Primary Examiner* — Adolf D Berhane
(74) *Attorney, Agent, or Firm* — Chen Yoshimura LLP

(57) ABSTRACT

A control circuit for an AC/DC converter includes an AC detection circuit that periodically determines from a change in the AC input voltage whether AC voltage is being input and, upon determining that AC voltage is being input, outputs an AC detection signal that takes a HIGH level only for a prescribed duration; and an enable signal conversion circuit that filters the AC detection signal to generate the enable signal that is in a HIGH state when the AC detection signal is in the HIGH level and that becomes the LOW state after a prescribed time has passed since the AC detection signal becomes a LOW level unless the AC detection signal rises to the HIGH level again, thereby producing the enable signal that is more responsive.

22 Claims, 10 Drawing Sheets

Example Configuration of AC/DC Converter According to Embodiment of Present Invention

(51) Int. Cl.
*G01R 19/155* (2006.01)
*H02M 1/42* (2007.01)
*H02M 1/32* (2007.01)
*G01R 19/12* (2006.01)
*H02M 3/335* (2006.01)
*H02M 1/12* (2006.01)
*H02M 1/00* (2006.01)

(52) U.S. Cl.
CPC ........... *H02M 1/32* (2013.01); *H02M 1/4258* (2013.01); *H02M 3/33507* (2013.01); *H02M 1/126* (2013.01); *H02M 2001/007* (2013.01); *H02M 2001/322* (2013.01)

(58) Field of Classification Search
CPC ...... H02M 2001/007; H02M 2001/322; G01R 19/12; G01R 19/155; G01R 31/40
See application file for complete search history.

(56) References Cited

U.S. PATENT DOCUMENTS

| | | | |
|---|---|---|---|
| 2013/0027999 A1* | 1/2013 | Ptacek | H02M 1/36 363/126 |
| 2013/0033236 A1* | 2/2013 | Li | H02J 7/0036 320/166 |
| 2013/0147440 A1* | 6/2013 | Shiroyama | H02M 7/217 320/166 |
| 2013/0235627 A1* | 9/2013 | Huang | H02M 1/14 363/44 |
| 2014/0347034 A1 | 11/2014 | Yamada | |
| 2016/0072403 A1* | 3/2016 | Niwa | H02M 1/4225 363/89 |
| 2016/0241135 A1* | 8/2016 | Zhao | H02M 1/44 |
| 2017/0187217 A1* | 6/2017 | Gong | G01R 19/155 |
| 2018/0019656 A1 | 1/2018 | Matsuda et al. | |
| 2019/0074761 A1* | 3/2019 | Matsuda | H02M 1/32 |
| 2019/0098159 A1* | 3/2019 | Asano | H02M 3/33507 |
| 2019/0181634 A1* | 6/2019 | Saji | H02M 1/143 |
| 2020/0127555 A1* | 4/2020 | Matsuda | H02M 1/36 |
| 2020/0144906 A1* | 5/2020 | Endo | H02M 3/33507 |

FOREIGN PATENT DOCUMENTS

| | | |
|---|---|---|
| JP | 2016-158310 A | 9/2016 |
| WO | 2012/033120 A1 | 3/2012 |
| WO | 2013/047251 A1 | 4/2013 |

OTHER PUBLICATIONS

Japanese Office Action dated Nov. 17, 2020 in a counterpart Japanese patent application No. 2017-051039. (A machine translation (not reviewed for accuracy) attached.).

* cited by examiner (First) Configuration of AC Detection Circuit Built into Power Supply Control IC According to Embodiment of Present Invention, and Operation Waveforms of This Circuit (Second) Configuration of AC Detection Circuit Built into Power Supply Control IC According to Embodiment of Present Invention, and Operation Waveforms of This Circuit Example of AC Detection Circuit Using Circuit Illustrated in FIG. 5

Configuration of Conventional AC Input Voltage Cutoff Detection Circuit
Used in AC Detection Circuit Illustrated in FIG. 4

US 10,938,315 B2

CONTROL CIRCUIT FOR AC/DC CONVERTER

BACKGROUND OF THE INVENTION

Technical Field

The present invention relates to an AC/DC converter control circuit which, upon detecting that an AC (alternating current) input voltage has been cut off, shuts down a power supply, discharges capacitors storing high voltages, and so on. More particularly, the present invention relates to an AC/DC converter control circuit which makes it possible to initiate a secondary-side shutdown process without waiting for discharge from an X capacitor after an AC input voltage is cut off.

Background Art

AC detection circuits are a conventionally well-known type of circuit needed to safely operate AC/DC converters and the like and are used to detect when an AC input voltage has been cut off and then shut down any power supplies to which the AC input voltage was connected, discharge any capacitors storing high voltages, and so on.

FIG. 8 illustrates an example configuration of an AC/DC converter including a conventional AC detection circuit. FIG. 9 illustrates an example of a specific application of the conventional AC/DC converter illustrated in FIG. 8. Note that in FIG. 9, components that are the same as in FIG. 8 are labeled with the same reference characters as in FIG. 8.

The conventional AC detection circuit in FIG. 8 is included as one component of the AC/DC converter, in which a primary side and a secondary side are coupled via a transformer. In other words, this configuration for converting AC to DC (direct current) includes, in the following order, AC input unit 71 to which an AC voltage is input, a filter circuit 72 for removing noise, a full-wave rectifier circuit 73 which rectifies the input AC voltage to generate a DC voltage, a capacitor 74 which smooths and stores the generated DC voltage, a transformer 75 which couples together at least the primary side and the secondary side, and a smoothing circuit 77 which rectifies and smooths AC induced on the secondary side.

The DC voltage resulting from the charge stored in the capacitor 74 is converted to AC by switching a switch 76 on the basis of a control signal (such as a PWM signal) output from an OUT terminal of a power supply control IC 80, thereby causing an AC voltage to be induced on the secondary side via the transformer 75. The resulting AC voltage is then converted back to DC upon being rectified and smoothed by the smoothing circuit 77, and this DC is output as power supply output (AC/DC converter output) 78.

The filter circuit 72 is constituted by inductors and a capacitor. Moreover, the filter circuit 72 prevents noise coming in via the AC input unit 71 as well as noise originating from the switching operation of the AC/DC converter from propagating to external systems. However, even when the supplied AC power source is cut off, charge remains stored in the capacitor in the filter circuit 72, and the associated voltage creates an electric shock hazard. To eliminate this hazard, in Non-Patent Document 1, for example, the power supply control IC includes a discharge circuit for discharging the charge stored in the capacitor in the filter circuit at the AC input unit, which is known as an X capacitor (hereinafter, also referred to simply as an "Xcap").

Moreover, the anodes of a pair of cathode-connected diodes D11 and D12 are respectively connected to AC lines connected to the terminals of the AC power source, and the node between these diodes D11 and D12 is connected to a VH terminal of the power supply control IC 80 and also input to an AC detection circuit 81.

The conventional AC detection circuit 81 compares a divided voltage from the VH terminal voltage to a prescribed threshold value, outputs a high (H) level signal when the divided voltage from the VH terminal voltage is higher than the threshold value, and outputs a low (L) signal when the divided voltage is lower than the threshold value. Once the rectified component of the AC input can be obtained stably, an AC detection output which changes in a periodic manner is output to a downstream EN signal conversion circuit 82. An output signal EN from the EN signal conversion circuit 82 is a signal indicating whether the rectified component of the AC is being obtained in a steady-state manner (here, "EN" is an abbreviation for "enable").

An EN control circuit which controls a DC/DC converter (hereinafter, also referred to simply as "DC/DC") 83 on the secondary side of the switching power supply system described above includes the illustrated AC detection circuit 81 and the EN signal conversion circuit 82, which converts the output from the AC detection circuit 81 to the EN signal.

As will also be described with reference to FIG. 6 for the components of the present disclosure, the EN signal conversion circuit 82 includes a switching device 111 controlled by the AC detection signal output, as well as a delay circuit (time constant circuit) 112 constituted by a resistor R61 and a capacitor C61, and performs a filtering process on the AC detection signal input from the AC detection circuit 81 and outputs an EN signal 113 to the DC/DC converter 83. This filtering process is a type of low-pass filtering process, as will be described below.

In other words, the minimum signal value of the EN signal 113 (the output of the EN signal conversion circuit 82) is controlled so as to never fall below an enable threshold value (hereinafter, also referred to as "EN threshold value") of the secondary-side DC/DC converter 83 while the AC input voltage is being input normally. More specifically, each time the switching device 111 is switched ON, the capacitor C61 is instantaneously charged to a voltage VDD. Then, when the switching device 111 is switched OFF, the voltage of the capacitor C61 decreases in accordance with the time constant of the resistor R61 and the capacitor C61. However, while the AC input voltage is being input normally, the switching device 111 is switched ON periodically (every switching cycle or every half switching cycle), and therefore the voltage of the capacitor C61 (which is the EN signal 113) never decreases to the EN threshold value.

Meanwhile, when the AC input is cut off while the VH terminal voltage is lower than the threshold value of the conventional AC detection circuit 81, the EN signal 113 becomes lower than the EN threshold value. The DC/DC converter 83 can detect this to determine that the AC input voltage has been cut off and then proceed to initiate a shutdown process.

However, when the AC input is cut off while the VH terminal voltage is higher than the threshold value of the conventional AC detection circuit 81, the VH terminal voltage from when the AC input was cut off decreases only gradually due to the current consumption of the power supply control IC 80 and natural discharge or the like, and therefore the output of the AC detection circuit 81 remains at the H level and the additional Xcap discharge feature of the power supply control IC 80 is triggered, which allows the EN signal 113 to finally fall once the input voltage to the transformer 75 and the output voltage of the DC/DC converter 83 which receives that input voltage decrease.

Furthermore, the DC output voltage induced on the secondary side is fed back to the primary side via a feedback controller 84 to an FB terminal of the power supply control IC 80 and is used for control purposes to make it possible to supply a stable DC voltage to the secondary side as the power supply output 78. The output of a VCC voltage generator 79 which rectifies and obtains AC induced in a primary-side auxiliary coil is connected to a VCC terminal of the power supply control IC 80.

In an example of an application for the power supply output 78, the DC/DC converter 83 is prepared as illustrated in FIG. 9, and the power converted to DC on the secondary side (that is, the power supply output 78) is DC/DC converted and used as a power supply or the like for a microcomputer 85 or the like, for example. The microcomputer 85 controls a load system (86, 87) driven by the power supply output 78, which has a higher voltage than the supply voltage for the microcomputer 85, for example.

The load system includes a main load circuit (for example, presentation control unit 87 for audio, illumination (such as LEDs) and the like) and a data storage circuit 86 which stores various types of data, parameters or the like of the load system into memory. Examples of data to be stored in the memory of the data storage circuit 86 include channel information, audio settings information, other settings information, and the like. Moreover, the output of the data storage circuit 86 is the various types of stored settings information.

In the example application of the power supply output 78 described above, one desirable functionality is the following. The microcomputer 85 should be able to detect decreases in the output of the DC/DC 83 and save data by just before when the power supply output turns off.

When the microcomputer 85 detects a decrease in the output of the DC/DC 83, the microcomputer 85 outputs a data storage signal to the data storage circuit 86. The data storage circuit 86 receives this signal and saves the various types of settings information described above in the internal memory of the data storage circuit 86.

FIG. 10 illustrates a control scheme based on the output of the AC detection circuit in the conventional configuration illustrated in FIG. 9. In the configuration illustrated in FIG. 9, the uppermost waveform in FIG. 10 is the VH terminal voltage waveform, which is input to the VH terminal of the power supply control IC 80 illustrated in FIGS. 8 and 9 and is obtained by using two resistors (not illustrated in the figures) to voltage-divide the rectified voltage of the AC input voltage obtained via the diodes D11 and D12 connected to the AC lines.

The second waveform from the top is the rectangular-wave AC detection signal obtained at the AC detection circuit 81 by comparing the divided voltage from the AC input voltage to the prescribed threshold value described above.

The third waveform from the top is the DC/DC EN signal output from the EN signal conversion circuit 82. During periods in which the AC detection circuit 81 is able to detect an AC waveform, the AC detection signal switches between the low and high levels periodically, which causes the DC/DC EN signal to repeatedly fall and rise in a periodic manner as well, although the DC/DC EN signal never falls below the enable threshold value. Then, as described above, when the AC input is cut off while the VH terminal voltage is higher than the threshold value of the conventional AC detection circuit 81, the VH terminal voltage (which is determined by the charge voltage of the X capacitor) decreases only gradually due to the current consumption of the power supply control IC 80 and natural discharge, and therefore the output of the AC detection circuit 81 remains at the H level. Moreover, the Xcap discharge feature (an additional feature of the power supply control IC 80) is triggered, which allows the EN signal 113 to finally fall once the input voltage to the transformer 75 and the output voltage of the DC/DC converter 83 which receives that input voltage decrease.

The fourth waveform from the top is the DC/DC output voltage output from the DC/DC converter 83. During periods in which the DC/DC EN signal is greater than the enable threshold value, the DC/DC converter 83 continues normal operation and therefore produces a high-level output.

The second waveform from the bottom is the data storage signal output from the microcomputer 85 to the data storage circuit 86 upon detection of a decrease in the DC/DC output voltage. The data storage circuit 86 receives this signal and stores any data indicated by this data storage instruction in internal memory.

The bottommost waveform in FIG. 10 illustrates the change in the power supply output 78 when the AC input voltage is cut off.

Meanwhile, the conventional technology disclosed in Patent Document 1 describes a light source device which generates a rectangular wave signal by using a comparator to compare the output of a diode bridge for full-wave rectifying an AC voltage to a reference value and, when the rectangular wave signal stops oscillating, determines that a temporary power outage has occurred and reduces drive current for light sources in a light driving unit.

The conventional technologies disclosed in Patent Document 2 and Non-Patent Document 1 describe discharging the charge of an Xcap upon detecting that an AC input has been cut off.

RELATED ART DOCUMENTS

Patent Documents

Patent Document 1: Japanese Patent Application Laid-Open Publication No. 2011-160629 (FIG. 4)
Patent Document 2: WO 2012/033120 (republication)

Non-Patent Document

Non-Patent Document 1: YABUZAKI, Jun et al., "6th Generation PWM Controller IC: FA8A00 Series", Fuji Electric Journal, Fuji Electric Co., Ltd., 2012, Vol. 85, No. 6, pp. 452-456 (FIG. 2)

SUMMARY OF THE INVENTION

In the conventional technology illustrated in FIGS. 8 to 10, when the AC input is cut off while the VH terminal voltage is higher than the threshold value of the conventional AC detection circuit 81, the EN (enable control) signal does not fall immediately because it takes time for the Xcap discharge feature to begin working after the AC input is cut off. This delays output of the data storage signal to the data storage circuit (memory) 86 and negatively affects the reset time of the load system.

In other words, depending on when the AC input is cut off, the secondary-side DC/DC converter can potentially shut down at the same time as when the power supply output decreases, in which case it is sometimes not possible to effectively protect the load system.

Furthermore, simply reducing the time from when the AC input is cut off until the Xcap is discharged by the Xcap discharge feature can potentially cause the Xcap to be discharged in every AC cycle, in which case it is not possible to allocate time for shutting down the secondary-side load system and saving data.

In addition, although repurposing the feature for reducing drive current for light sources as described in Patent Document 1 for use in shutting down a load system of the type in the present application could yield a configuration similar to that of the present invention, Patent Document 1 does not disclose any way of determining whether a rectangular wave signal has stopped oscillating.

Moreover, although Patent Document 2 and Non-Patent Document 1 disclose discharging the charge of an Xcap upon detecting that an AC input has been cut off, these documents do not disclose or suggest any solutions for, in a power supply system of the type in the present invention, in which the output of an AC/DC converter is connected to a DC/DC converter, balancing and handling the time required for both of the following: the time from when cutoff of the AC input is detected and the Xcap is discharged until when the output of the AC/DC converter turns off, and the time required to process shutdown of the load connected to the output of the AC/DC converter (for example, the time from when the microcomputer outputs the data storage signal until when the output of the AC/DC converter turns off).

Therefore, the present invention aims to provide an AC/DC converter control circuit which shuts down a secondary-side load system without waiting for an Xcap to discharge after AC input is cut off, even if the AC input is cut off while a VH terminal voltage is high.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a control circuit for an AC/DC converter that converts an AC input voltage to DC power output and supplies the DC power output to a load system, the load system being configured to receive an enable signal for enabling and disabling operations of the load system, the load system being shut down when the enabling signal is in a LOW state, the control circuit including: an AC detection circuit that periodically determines from a change in the AC input voltage whether AC voltage is being input and, upon determining that AC voltage is being input, outputs an AC detection signal that takes a HIGH level only for a prescribed duration; and an enable signal conversion circuit that filters the AC detection signal to generate the enable signal that is in a HIGH state when the AC detection signal is in the HIGH level and that becomes the LOW state after a prescribed time has passed since the AC detection signal becomes a LOW level unless the AC detection signal rises to the HIGH level again.

In the configuration described above, a HIGH level period of the prescribed duration for the AC detection signal may be set by a timer, and a starting time of the HIGH level period may be set in accordance with detection of a rise in an the AC input voltage.

In the configuration described above, the HIGH level period of the prescribed duration for the AC detection signal may be set to ¼ to ½ of a period of the AC input voltage.

The configuration described above may further include: a discharge control timer for controlling discharge of an X capacitor connected to an input unit for the AC input voltage, wherein the discharge control timer is reset by the AC detection signal, and when the discharge control timer finishes counting, an instruction to discharge the X capacitor is sent.

In any of the configurations described above, the AC detection circuit may include: a comparator that compares an AC representative voltage derived from the AC input voltage with a prescribed reference voltage; a counter that takes as input a reset signal generated when the AC representative voltage falls below the reference voltage and then begins a counting operation upon the reset signal being cleared when the AC representative voltage becomes greater than the reference voltage; a pulse generator that generates a single pulse when the AC representative voltage becomes greater than the reference voltage; and a flip-flop having a set terminal to which a pulse output from the pulse generator, wherein the flip-flop is reset when the AC representative voltage falls below the reference voltage or when the counter finishes counting, and wherein an output of the flip-flop is used as the AC detection signal.

In the configuration described above, the AC representative voltage may be a divided voltage of a voltage that obtained by half-wave rectifying the AC input voltage.

Moreover, in any of the configurations described above, the AC detection circuit may include: a selection circuit that receives an upper reference voltage and a lower reference voltage and selectively outputs one of the upper reference voltage and the lower reference voltage as a selection circuit output; a comparator that compares an AC representative voltage derived from the AC input voltage with the upper or lower reference voltage selected and outputted by the selection circuit; a control logic unit that sends, to the selection circuit, an instruction indicating whether to select the upper reference voltage or the lower reference voltage, and, upon detecting that the AC representative voltage is greater than the upper reference voltage or lower than the lower reference voltage, changes the upper limit reference and the lower reference voltage that are received and selected by the selection circuit; a reset signal generation unit that outputs a reset pulse when the AC representative voltage becomes greater than the upper reference voltage selected by the selection circuit; and a counter that sets an output thereof to a HIGH level upon being reset by the reset pulse, starts counting when this reset is cleared, and sets the output to a LOW level upon counting to a prescribed count time, and wherein the output of the counter is used as the AC detection signal.

In the configuration described above, the count time to which the counter unit counts may be set to ¼ to ½ of a period of the AC input voltage.

The present disclosure makes the DC/DC converter fall earlier relative to the fall of the power supply output than in conventional technologies, thereby making it possible to easily protect the secondary side.

Moreover, the present disclosure makes it possible to allocate time for writing data and resetting when the power supply system shuts down.

Furthermore, in the present disclosure, the power supply control IC handles AC detection, thereby making it possible to remove AC detection circuits of the type connected as external circuits in conventional configurations.

It is to be understood that both the foregoing general description and the following detailed description are exemplary and explanatory, and are intended to provide further explanation of the invention as claimed.

DETAILED DESCRIPTION OF EMBODIMENTS

Next, an embodiment of the present disclosure will be described in detail.

Figure 1:
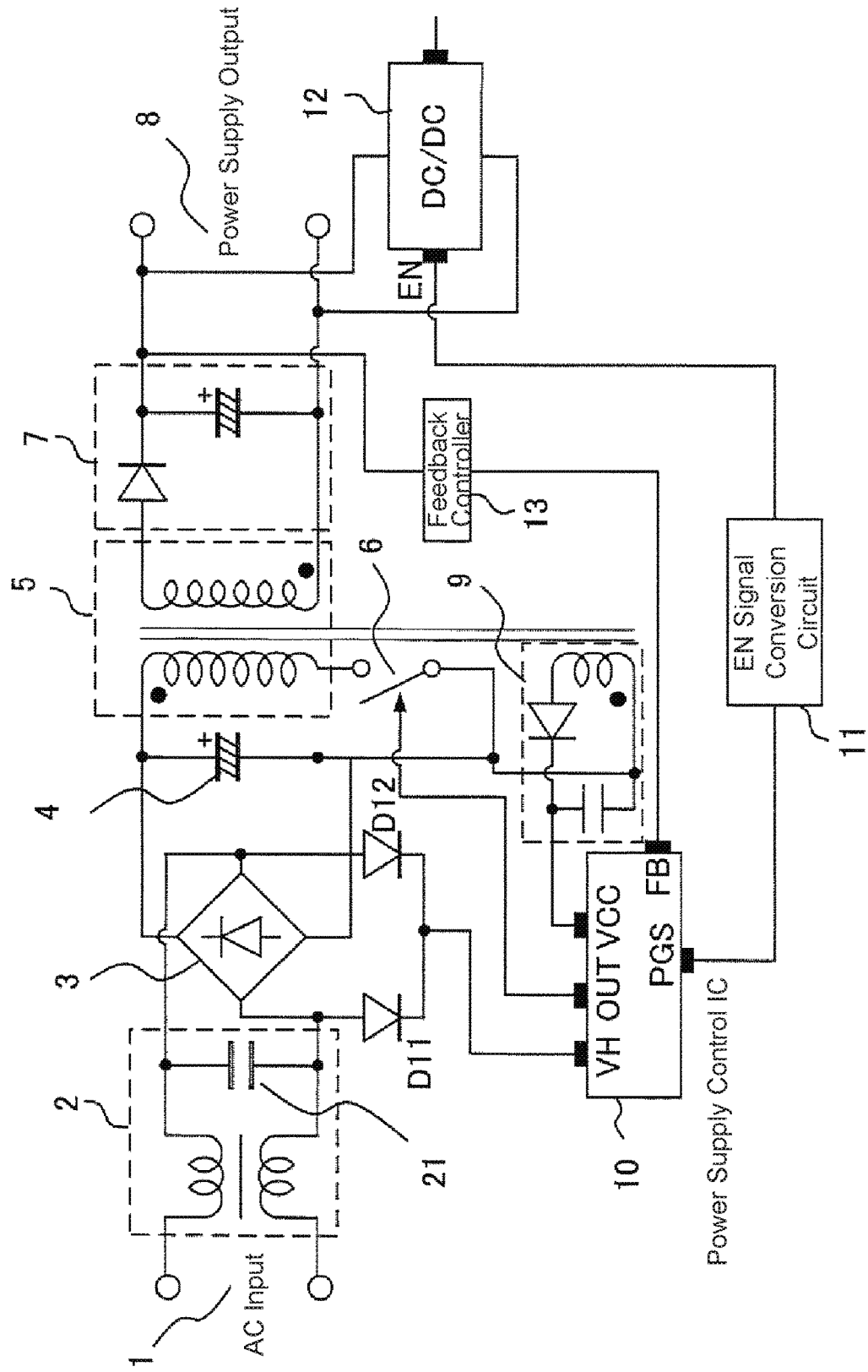
FIG. 1 illustrates an example configuration of an AC/DC converter according to an embodiment of the present invention.
Figure 2:
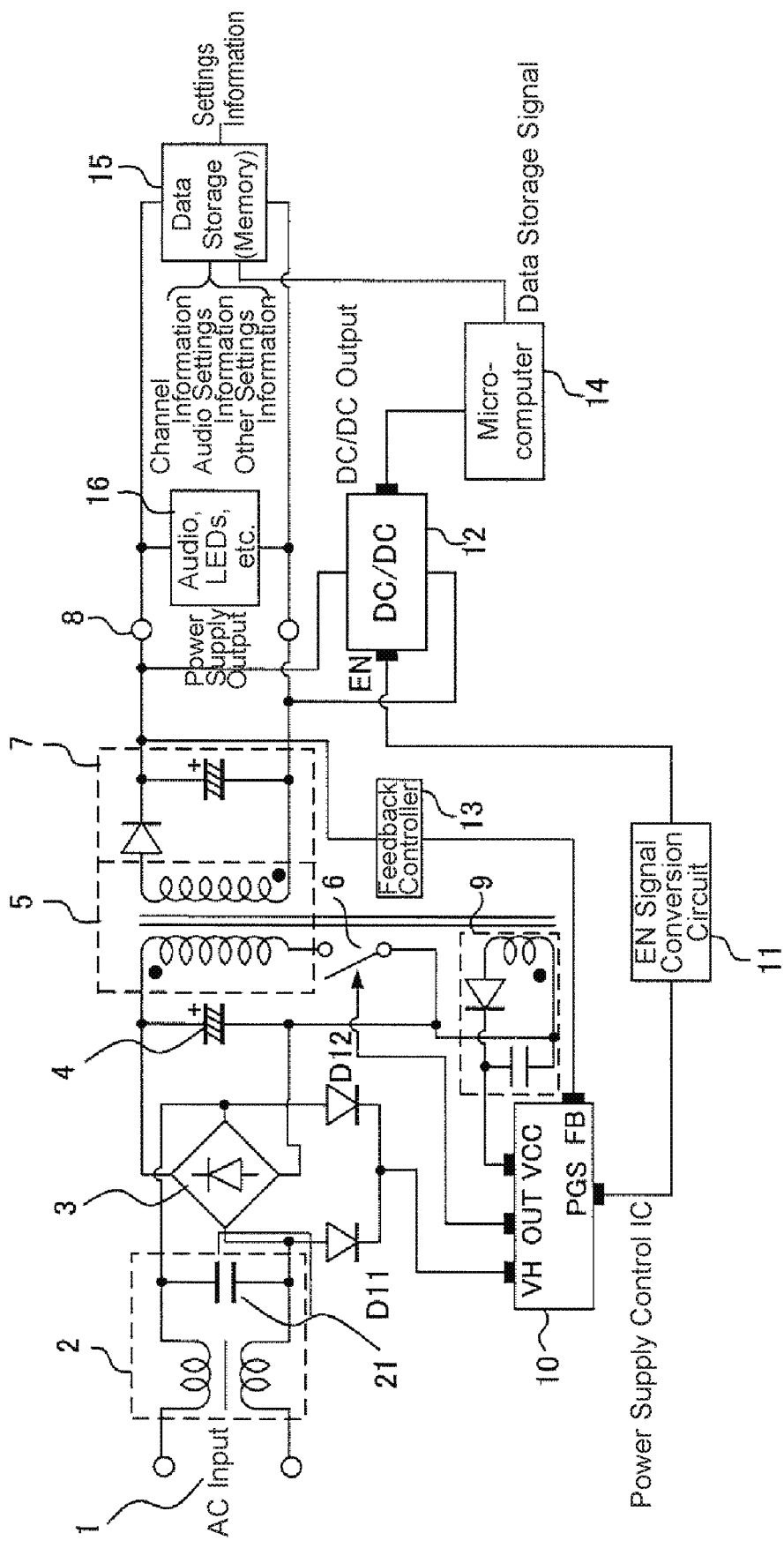
FIG. 2 illustrates an example of a specific application of the AC/DC converter illustrated in FIG. 1.

FIG. 1 illustrates an example configuration of an AC/DC converter according to the embodiment of the present disclosure. FIG. 2 illustrates an example of a specific application of the AC/DC converter illustrated in FIG. 1. Note that in FIG. 2, components that are the same as in FIG. 1 are labeled with the same reference characters as in FIG. 1.

In FIG. 1, an AC detection circuit according to the embodiment of the present disclosure is included as one component of the AC/DC converter, in which a primary side and a secondary side are coupled via a transformer. In other words, this configuration for converting alternating current (AC) to direct current (DC) includes, in the following order, an AC input unit 1 to which an AC voltage is input, a filter circuit 2 for removing noise, a full-wave rectifier circuit 3 which rectifies the input AC voltage to generate a DC voltage, a capacitor 4 which smooths and stores the generated DC voltage, a transformer 5 which couples together at least the primary side and the secondary side, and a smoothing circuit 7 which rectifies and smooths AC induced on the secondary side.

Meanwhile, the DC voltage resulting from the charge stored in the capacitor 4 is converted to AC by controlling switching of a switch 6 on the basis of a control signal (such as a PWM signal) output from an OUT terminal of a power supply control IC 10, thereby causing an AC voltage to be induced on the secondary side via the transformer 5. The resulting AC is then converted back to DC upon being rectified and smoothed by the smoothing circuit 7, and this DC is output as power supply output (AC/DC converter output) 8.

The filter circuit 2 is constituted by inductors and an X capacitor 21. The filter circuit 2 prevents noise coming in via the AC input unit 1 as well as noise originating from the switching operation of the AC/DC converter from propagating to external systems.

Here, even when the AC power source supplying AC power is cut off, charge remains stored in the X capacitor 21 in the filter circuit 2, and the associated voltage creates an electric shock hazard. To eliminate this hazard, an X capacitor (Xcap) discharge circuit of the type described in Non-Patent Document 1, for example, is prepared within the power supply control IC 10. This discharge circuit discharges the X capacitor by connecting a VH terminal to a ground voltage, for example.

Moreover, the anodes of a pair of cathode-connected diodes D11 and D12 are respectively connected to AC lines connected to the terminals of the AC power source, and the node between these diodes D11 and D12 is input to the power supply control IC 10 via the VH terminal of the power supply control IC 10.

In the embodiment of the present disclosure, the AC detection circuit (for which (first and second) example configurations and operation waveforms thereof are illustrated in FIGS. 3 and 4) is built into the power supply control IC 10, and when a voltage obtained by rectifying the AC is being input in a stable manner to the VH terminal of the power supply control IC 10, a pulse-shaped AC detection signal is output from a PGS (power good signal) terminal, which is a dedicated AC detection signal output terminal, of the power supply control IC 10.

Figure 3A:
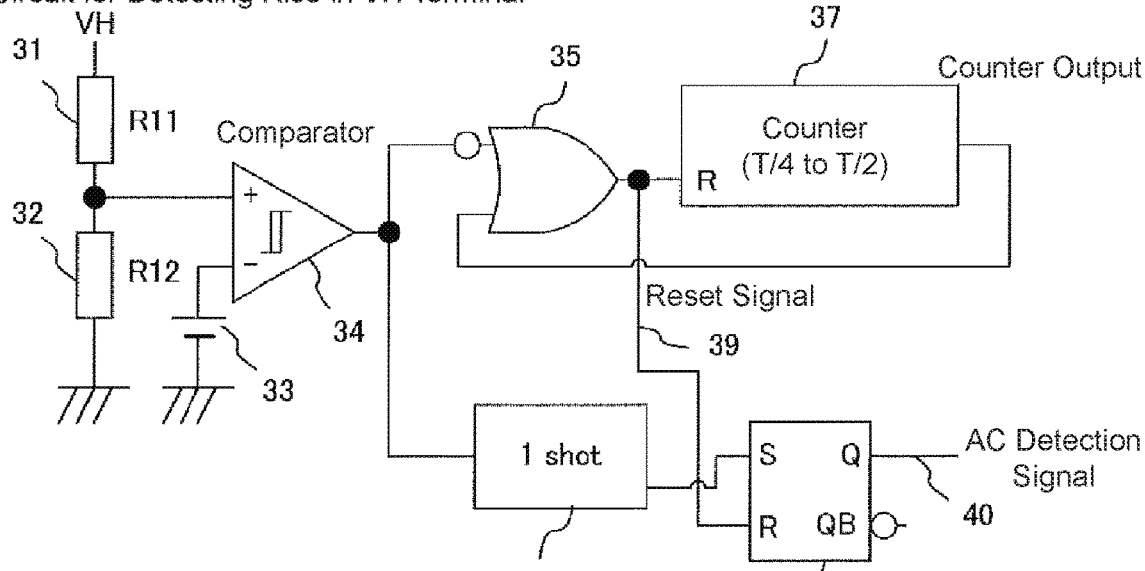
FIG. 3A illustrates a (first) configuration of an AC detection circuit built into a power supply control IC according to an embodiment of the present invention.
Figure 3B:
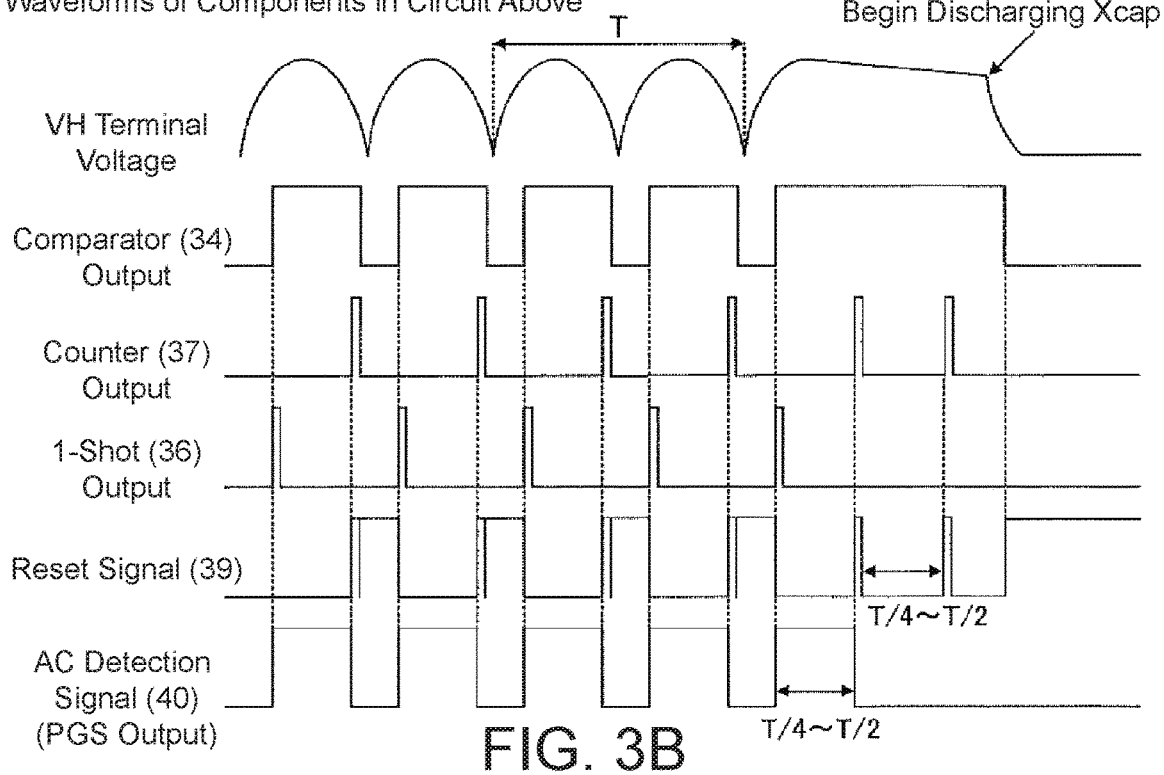
FIG. 3B illustrates operation waveforms of the circuit illustrated in FIG. 3A.
Figure 4A:
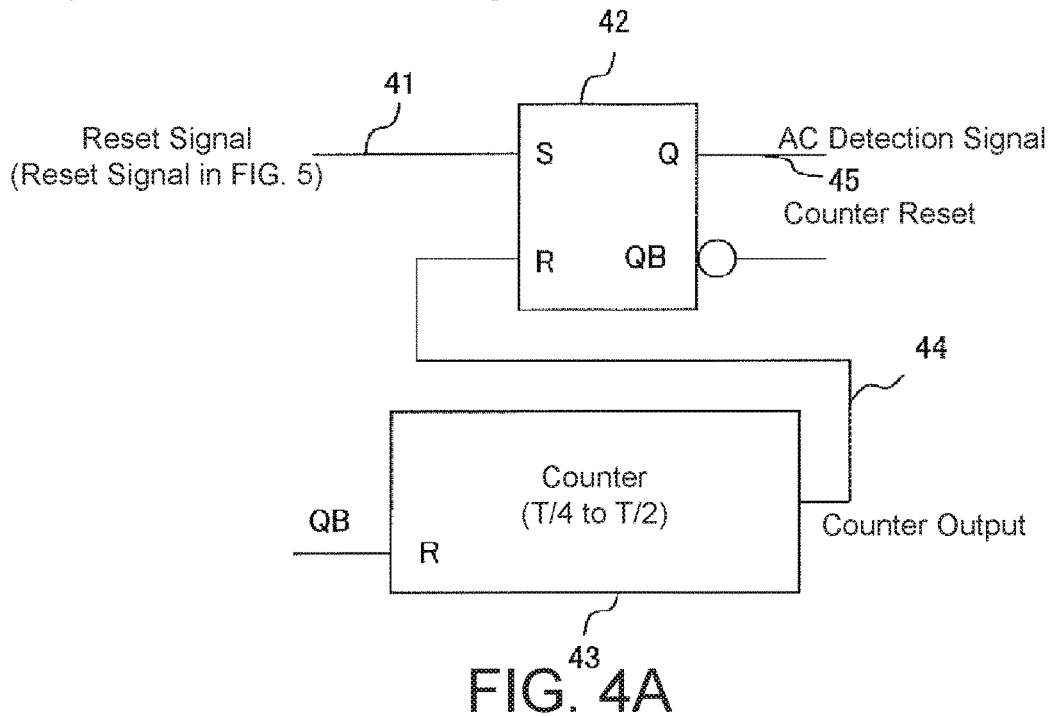
FIG. 4A illustrates a (second) configuration of the AC detection circuit built into the power supply control IC according to the embodiment of the present invention.
Figure 4B:
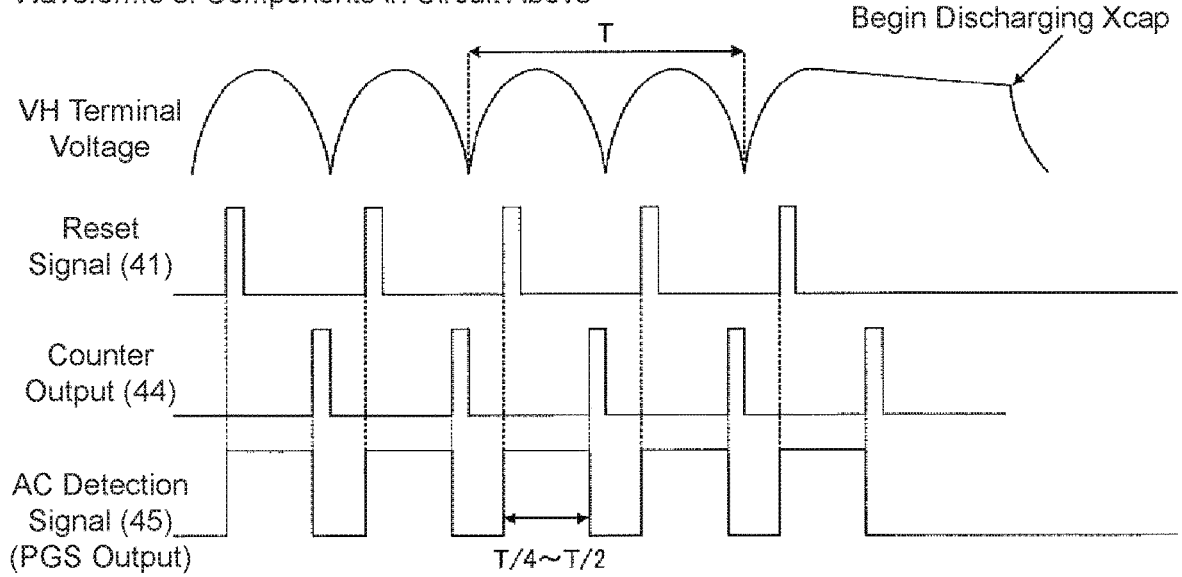
FIG. 4B illustrates operation waveforms of the circuit illustrated in FIG. 4A.

As illustrated by the bottommost waveforms in FIGS. 3B and 4B, the AC detection signal is matched to the rise of the VH terminal voltage (illustrated by the uppermost waveforms) so as to obtain a signal waveform in which the pulses rise and have a constant pulse width. This will be described in more detail later.

Figure 6:
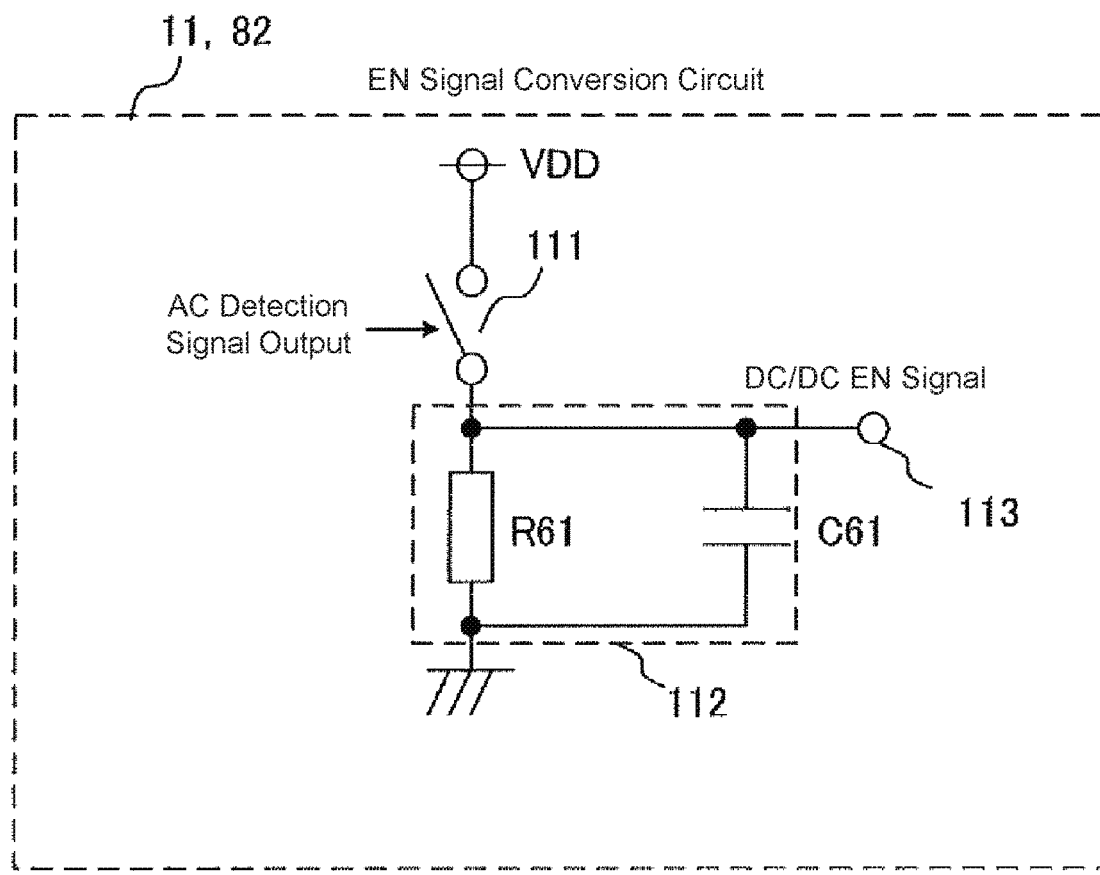
FIG. 6 illustrates an example configuration of an EN signal conversion circuit according to the present invention.

The output AC detection signal (PGS) output is input to an enable control (EN) signal conversion circuit 11. As illustrated in FIG. 6, the EN signal conversion circuit 11 includes a switching device 111 controlled by the AC detection signal (PGS) output from the power supply control IC 10, and a delay circuit (time constant circuit) 112 constituted by a resistor R61 and a capacitor C61. The operation of the EN signal conversion circuit 11 is the same as that of the EN signal conversion circuit 82 described in the Background Art section. In other words, similar to the EN signal conversion circuit 82, the EN signal conversion circuit 11 performs a filtering process on the AC detection signal and outputs an enable (EN) signal 113 to a DC/DC converter 12. Also similar to in the EN signal conversion circuit 82, this filtering process is a type of low-pass filtering process.

As illustrated by the middle waveform in FIG. 7A, the minimum signal value of the EN signal 113 (the output of the EN signal conversion circuit 11) is controlled so as to never fall below an enable threshold value (EN threshold value) of the secondary-side DC/DC converter 12 while the AC input voltage is being input normally.

Meanwhile, when the AC input is cut off, the EN signal 113 falls below the enable threshold value and thereby makes it possible for the DC/DC converter 12 to initiate a shutdown process.

Here, when the AC input is cut off, the AC detection circuit in the power supply control IC 10 detects the change in the VH terminal, and once the Xcap discharge feature (an additional feature of the power supply control IC 10) discharges the Xcap after a prescribed period of time, the VH terminal voltage decreases rapidly.

Furthermore, the DC supply voltage induced on the secondary side is fed back to the primary side via a feedback controller 13 to an FB terminal of the power supply control IC 10 and is used for control purposes to make it possible to supply a stable DC voltage to the secondary side as the power supply output 8. Moreover, the output of a VCC voltage generator 9 which rectifies and obtains AC induced in a primary-side auxiliary coil is connected to a VCC terminal of the power supply control IC 10.

In an example of an application for the power supply output 8, the DC/DC converter 12 is prepared as illustrated in FIG. 2, and the power supply output 8 is DC/DC-converted to provide a power supply or the like for a microcomputer 14 or the like, for example. The microcomputer 14 controls a load system (15, 16) driven by the power supply output 8, which has a higher voltage than the supply voltage for the microcomputer 14, for example.

The load system includes a main load circuit (for example, presentation control unit 16 for audio, illumination (such as LEDs) and the like) and a data storage circuit 15 which stores various types of data, parameters or the like of the load system into memory. Examples of data to be stored in the memory of the data storage circuit 15 include channel information, audio settings information, other settings information, and the like. The output of the data storage circuit is the various types of stored settings information.

In the example application of the power supply output 8 described above, one desirable functionality is the following.

The microcomputer 14 should be able to detect decreases in the output of the DC/DC converter 12 and save data before when the power supply output 8 turns off.

Thus, when the microcomputer 14 detects a decrease in the output of the DC/DC converter 12, the microcomputer 14 outputs a data storage signal to the data storage circuit 15. The data storage circuit 15 receives this signal and saves the various types of settings information described above in internal memory.

FIG. 3A illustrates a (first) configuration of the AC detection circuit built into the power supply control IC according to the embodiment of the present disclosure, and FIG. 3B illustrates operation waveforms of the circuit illustrated in FIG. 3A.

FIG. 3A illustrates the AC detection circuit for detecting rises in the VH terminal voltage. The voltage input to the VH terminal of the power supply control IC 10 illustrated in FIGS. 1 and 2 is voltage-divided by a resistor (R11) 31 and a resistor (R12) 32 and then applied to the non-inverting input terminal of a comparator 34. The inverting input terminal of the comparator 34 is connected to a reference power supply 33. Here, the same reference character 33 will also be used for a reference voltage output from the reference power supply 33. Furthermore, the comparator 34 is a hysteresis comparator, and the reference voltage of the reference power supply 33 actually switches between two levels (high and low) according to whether the output of the comparator 34 is at a high (H) level or a low (L) level.

The output of the comparator 34 is input to one input terminal of an OR circuit 35, and the output terminal of the OR circuit 35 is input to a reset terminal R of a counter 37. The output terminal of the counter 37 is input to another input terminal of the OR circuit 35. The one input terminal of the OR circuit 35 is an inverting input terminal, while the other input terminal is a non-inverting input terminal, and therefore when the output of the comparator 34 takes the L level or the counter 37 finishes counting, a reset signal is input to the counter 37.

The output of the comparator 34 is also input to a one-shot (1-shot) circuit 36. The output terminal of the 1-shot circuit 36 is connected to the set terminal S of a flip-flop (FF) circuit 38. The 1-shot circuit 36 outputs a single pulse signal when the output of the comparator 34 rises, thereby setting the FF circuit 38. The output terminal of the OR circuit 35 is connected to the reset terminal of the FF circuit 38.

FIG. 3B illustrates the operation waveforms of the components in FIG. 3A. Next, the operation of FIG. 3A will be described with reference to the operation waveforms illustrated in FIG. 3B.

The uppermost waveform in FIG. 3B is the voltage waveform applied to the VH terminal of the power supply control IC 10 illustrated in FIGS. 1 and 2. This voltage waveform is obtained by using the resistor (R11) 31 and the resistor (R12) 32 to voltage-divide the voltage obtained by full-wave rectifying the AC input voltage via the diodes D11 and D12 connected to the AC lines. The reference voltage for this operation waveform is the voltage of the low voltage-side output terminal of the full-wave rectifier circuit 3 which full-wave rectifies the AC input voltage.

As illustrated by the waveform second from the top in FIG. 3B, when the voltage-divided VH voltage is higher than the reference voltage 33, the output of the comparator 34 takes the H level, and when the voltage-divided VH voltage is lower than the reference voltage 33, the output of the comparator 34 takes the L level.

As illustrated by the waveform second from the bottom in FIG. 3B, when the divided voltage from VH becomes less than or equal to the reference voltage 33 of the comparator 34, a reset signal 39 is input to the counter 37 via the OR circuit 35. Thereafter, when the divided voltage becomes greater than or equal to reference voltage 33 of the comparator 34, the reset to the counter 37 is cleared, and the counter 37 begins a counting operation.

As illustrated by the waveform third from the top in FIG. 3B, when the output of the comparator 34 is at the H level and the counter 37 is currently counting up, the counter 37 outputs an L-level signal until being reset, and then outputs an H-level signal upon finishing counting.

The count-up value of the counter 37 is less than or equal to ½ of the period T of the AC input voltage and is set to (¼ to ½)×T, for example. In the example illustrated in FIG. 3B, before the output of the comparator 34 rises, the output of the counter 37 is at the L level, and the reset signal for the counter 37 is at the H level. Once the counter 37 is reset, the output of the counter 37 takes the L level, and the reset signal for the counter 37 also takes the L level. However, in the example illustrated in FIG. 3B, the output of the comparator 34 takes the L level immediately thereafter, and therefore the reset signal for the counter 37 takes the H level again.

Then, as illustrated by the waveform third from the bottom in FIG. 3B, when the output of the comparator 34 inverts to the H level, the 1-shot circuit 36 is triggered, and the 1-shot circuit 36 inputs a set signal to the FF circuit 38, which then outputs an H-level AC detection signal 40.

The FF circuit 38 is reset by the output of the OR circuit 35, and therefore when a fall in the divided voltage from VH is detected or the counter 37 finishes counting, the FF circuit 38 gets reset. As a result, even when the divided voltage remains greater than or equal to the reference voltage 33 of the comparator 34, once the timer time set to the counter 37 has elapsed, the counter 37 and the FF circuit 38 are reset, and the AC detection signal (PGS output) 40 takes the L level.

Then, when the comparator 34 detects a rise in the VH terminal voltage, the 1-shot circuit 36 outputs an H-level pulse (set signal) which sets the FF circuit 38 again, and the AC detection signal (PGS output) 40 takes the H level.

Therefore, when the output of the comparator 34 remains at the H level (that is, the divided voltage from VH does not fall to or below the reference voltage 33 of the comparator 34) and the output of the counter 37 changes from H to L (in other words, as illustrated on the right ends of the second and fourth waveforms from the bottom in FIG. 3B), once the counter 37 finishes counting up and the reset signal 39 is output, no set signal is input to the FF circuit 38 because the output of the comparator 34 continues to remain at the H level, and therefore the AC detection signal 40 is no longer output (in other words, this output remains at the L level). As will be described in more detail later, the DC/DC converter 12 illustrated in FIG. 2 detects via the EN (enable control) signal conversion circuit 11 that the AC detection signal 40 is remaining at the L level and thereby determines that the AC input voltage has been cut off. Due to this, the DC/DC converter 12 stops its power conversion operation, which causes its output to decrease. When the microcomputer 14 detects this decrease in the output of the DC/DC converter 12, the microcomputer 14 outputs a data storage signal to the data storage circuit 15. The data storage circuit 15 receives this signal and saves the various types of settings information described above in internal memory.

The AC detection circuit of the present embodiment makes it possible to, upon detecting that the AC input has been cut off (that is, upon determining that the AC detection signal 40 is no longer being output), shut down the DC/DC converter 12 (see FIGS. 1 and 2) without waiting for the Xcap to begin discharging as illustrated on the right side of FIG. 3B.

In other words, in a post-process for the load system after the AC input is cut off, it is possible to store data corresponding to the immediately preceding settings information at an earlier time, and it is also possible to allocate sufficient time for writing the data, for example. Moreover, referring to the time sequences illustrated in FIGS. 7A and 7B (described later) makes it clear that in regards to this operation/effect, the present embodiment allows the process described above to be performed at an earlier time than in conventional configurations and also secures sufficient time for writing the data.

Figure 5A:
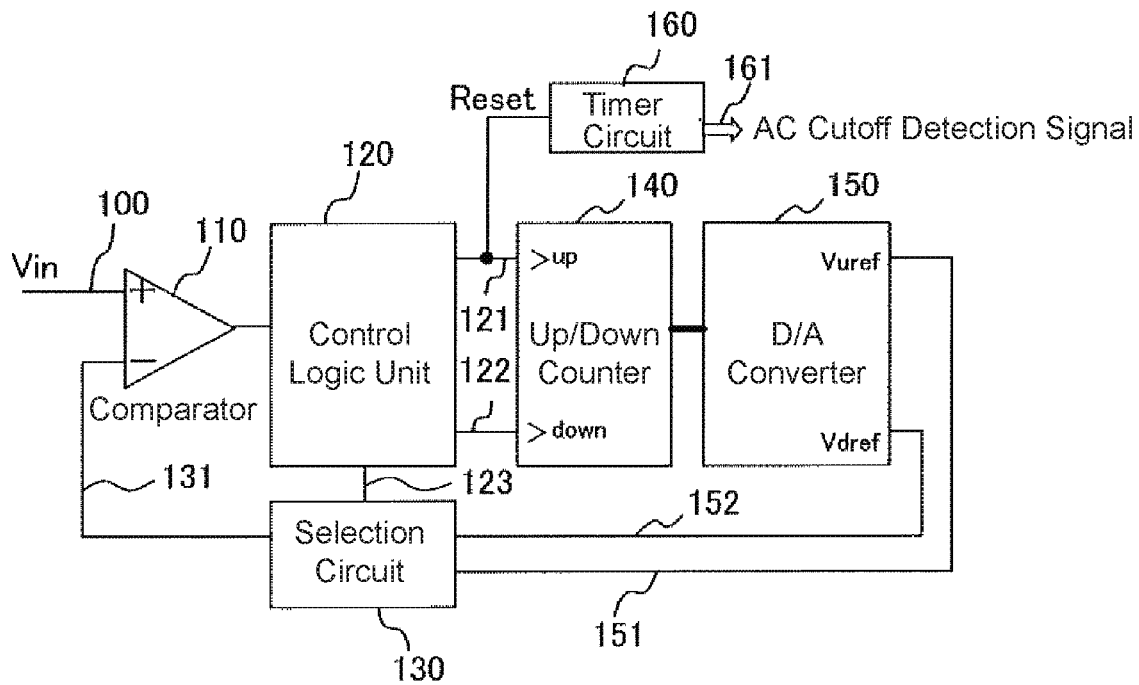
FIG. 5A illustrates a configuration of a conventional AC input voltage cutoff detection circuit used in the AC detection circuit illustrated in FIG. 4A.

FIG. 4A illustrates a (second) configuration of the AC detection circuit built into the power supply control IC according to the embodiment of the present disclosure, and FIG. 4B illustrates operation waveforms of the circuit illustrated in FIG. 4A. FIG. 4A illustrates a configuration in which a reset signal 121 from a conventional AC input voltage cutoff detection circuit illustrated in FIG. 5A is input to the S terminal of a flip-flop circuit (FF circuit) 42 and a signal output from the Q terminal of the FF circuit 42 is used as an AC detection signal 45.

As illustrated in FIG. 4A, a QB signal (inverted output signal) from the FF circuit 42 is connected to a reset (R) terminal of a counter 43. Once the FF circuit 42 is set, the reset to the counter 43 is cleared and the counter 43 begins counting. Upon finishing counting, the counter 43 outputs an H-level counter output (44).

This H-level counter output (44) is input to the reset (R) terminal of the FF circuit 42 to reset the FF circuit 42. When the FF circuit 42 is reset, the QB signal takes the H level, and therefore the counter 43 is also reset. Then, when the reset signal (41) (the reset signal (121) illustrated in FIG. 5A) is input to the reset FF circuit 42 again, the Q terminal of the FF circuit 42 outputs the AC detection signal (45) at the H level.

Moreover, similar to in the counter 37 illustrated in FIG. 3A, the count-up time of the counter 43 is set to (¼ to ½)×T. T is the period of the AC input voltage.

FIG. 4B illustrates the waveforms of the components illustrated in FIG. 4A. The uppermost waveform is the same as the uppermost waveform in FIG. 3B and represents the voltage waveform obtained by using the resistor (R11) 31 and the resistor (R12) 32 to voltage-divide the voltage input to the VH terminal of the power supply control IC 10 illustrated in FIGS. 1 and 2. Note that this VH terminal voltage is included here only to better illustrate the operation of the circuit illustrated in FIG. 4A and is not required for the circuit in FIG. 4A to operate.

The reset signal (41) illustrated second in FIG. 4B is the reset signal (121) from the conventional AC input voltage cutoff detection circuit illustrated in FIG. 5A. This reset signal (121) will be described in more detail later.

The counter output (44) illustrated third in FIG. 4B is the output signal (44) of the counter 43 in FIG. 4A and resets the AC detection signal (PGS output) 45 output from the Q terminal of the FF circuit 42 in FIG. 4A to the L level.

Moreover, the AC detection signal (45) illustrated at the bottom of FIG. 4B is the signal output from the Q terminal of the FF circuit 42, as described above. The time period for which the AC detection signal (45) is at the H level is equal to the time period for the counter 43 to reach its count-up value. Similar to in the counter 37, the time period until the count-up value is reached is set to ¼ to ½ of the period T of the AC voltage.

As illustrated in FIG. 4B, when the reset signal (121) is input to the set terminal S of the FF circuit 42, the FF circuit 42 is set and the AC detection signal (45) takes the H level. When the AC detection signal (45) takes the H level, the reset to the counter 43 is cleared, and the counter 43 begins counting (measures the time of ¼ to ½ of the preset period T). When the counter 43 finishes counting, the counter output (44) takes the H level, which resets the FF circuit 42, causes the AC detection signal (45) to take the L level, and resets the counter 43.

Here, when the AC input voltage is cut off, the reset signal (121) is no longer output from the conventional AC input voltage cutoff detection circuit illustrated in FIG. 5A. Meanwhile, if the AC detection signal (45) is at the H level at this time, the counter 43 is activated and then resets the FF circuit 42 upon finishing counting, and as a result the AC detection signal (45) takes and remains at the L level.

The process that follows this is the same as in the (first) configuration of the AC detection circuit illustrated in FIG. 3A and therefore will not be described here.

FIG. 5A illustrates the configuration of the conventional AC input voltage cutoff detection circuit used in the AC detection circuit illustrated in FIG. 4A. The conventional AC input voltage cutoff detection circuit illustrated in FIG. 5A was previously filed by Fuji Electric Co., Ltd. and has already been issued Japanese Patent No. 5842229.

The AC input voltage cutoff detection circuit illustrated in FIG. 5A includes: a selection circuit 130 which selects and outputs one of a quantized upper limit voltage Vuref (151) and a quantized lower limit voltage Vdref (152) as a selection circuit output (131) for use as a reference voltage for a comparator 110; a control logic unit 120 which controls the selection circuit 130 and generates a count-up signal (121) or a count-down signal (122) in accordance with the output of the comparator 110; an up/down counter 140 which counts up upon receiving the count-up signal (121) from the control logic unit 120 and counts down upon receiving the count-down signal (122); a digital-to-analog converter 150 which outputs the quantized upper limit voltage Vuref (151) and the quantized lower limit voltage Vdref (152) in accordance with digital values output by the up/down counter 140; and a timer circuit 160 which is reset by the count-up signal (121) output from the control logic unit 120 to the up/down counter 140.

Note that although detection of a detection signal Vin (100) in the AC input voltage cutoff detection circuit illustrated in FIG. 5A will not be described in detail here, this detection signal Vin (100) is a voltage obtained by voltage-dividing a voltage obtained by full-wave rectifying or half-wave rectifying the AC input voltage, and detection can be implemented by detecting a divided voltage from a voltage rectified by a full-wave rectifier circuit or a half-wave rectifier circuit, for example. The timer circuit 160, upon finishing counting without being reset, determines that the AC input voltage has been cut off and outputs an AC cutoff detection signal (161).

The control logic unit 120 has a period sufficiently shorter than the period of the AC input voltage (where here, it is assumed that there are no problems related to response time of the comparator 110) and repeats the operations below in (1) to (4).

(1) Use a control signal (123) to select and apply Vuref (151) to the inverting input terminal of the comparator 110 as the reference voltage for the comparator 110.

(2) Upper limit voltage comparison: If the output result of the comparator 110 indicates that Vin (100)>Vuref (151), output the count-up signal (121) (Vuref and Vdref then change due to the output result of the up/down counter 140).

(3) Use the control signal (123) to select and apply Vdref (152) to the inverting input terminal of the comparator 110 as the reference voltage for the comparator 110.

(4) Lower limit voltage comparison: If the output result of the comparator 110 indicates that Vin (100)<Vdref (152), output the count-down signal (122) (Vuref and Vdref then change due to the output result of the up/down counter 140).

Figure 5B:
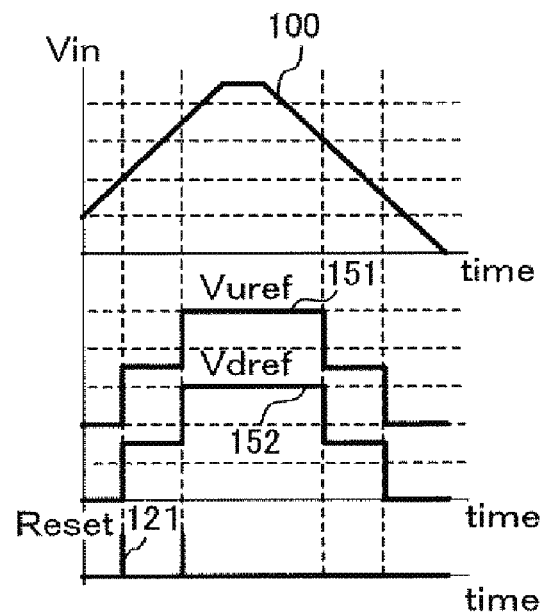
FIG. 5B illustrates operation waveforms of the AC input voltage cutoff detection circuit illustrated in FIG. 5A.

FIG. 5B illustrates the operation waveforms of the AC input voltage cutoff detection circuit illustrated in FIG. 5A. FIG. 5B illustrates how the quantized upper limit voltage Vuref (151) and the quantized lower limit voltage Vdref (152) change relative to the detection signal Vin (100) illustrated at the top.

When the detection signal Vin (100) increases, if Vin (100)>Vuref (151), the count-up operation is performed, which changes the output of the up/down counter 140 and causes the values of Vuref (151) and Vdref (152) to increase in a step-shaped manner. Whenever Vin (100) becomes greater than Vuref (151) again, this count-up operation is performed again in the same manner.

On the other hand, when the detection signal Vin (100) decreases, if Vin (100)<Vdref (152), the count-down operation is performed, which changes the output of the up/down counter 140 and causes the values of Vuref (151) and Vdref (152) to decrease in a step-shaped manner.

While the AC input voltage is connected, the detection signal Vin (100) exhibits changes of a certain magnitude at a prescribed period, and therefore the count-up signal (121) and the count-down signal (122) are output from the control logic unit 120.

The reset signal (121) is illustrated at the bottom of FIG. 5B. The AC detection circuit illustrated in FIG. 4A uses this reset signal (121) as the reset signal (41) illustrated at the top of FIG. 4A.

Returning to FIG. 5A, the timer circuit 160 is configured to be reset by the count-up signal (121) (or the count-down signal (122) may be used instead), and therefore while the AC input voltage is connected, no timeouts occur. Here, the count time of the timer circuit 160 is set to a time on the order of several dozen milliseconds, for example.

Meanwhile, when the AC input voltage is cut off, the detection signal Vin (100) only begins to decrease gradually, and the count-up signal (121) and the count-down signal (122) are not output from the control logic unit 120, so the timer circuit 160 does not get reset. Once in this state, the timer circuit 160 times out upon counting to 50 to 100 ms, for example, and the AC cutoff detection signal (161) is output from the timer circuit 160.

Note that in the example illustrated in the middle in FIG. 5B, an example in which the upper limit voltage Vuref (151) and the lower limit voltage Vdref (152) each have three levels (digital values) is illustrated, and the value of the upper limit voltage Vuref (151) corresponding to a given level (digital value) is set to a value slightly higher than a value of the lower limit voltage Vdref (152) which is in a one-level higher level (digital value).

Due to this, there is a difference (hysteresis width) between the levels at which the count-up signal (121) is generated when the detection signal Vin (100) is increasing and the levels at which the count-down signal (122) is generated when the detection signal Vin (100) is decreasing.

Although an example of using the reset signal 121 from the AC input voltage cutoff detection circuit illustrated in FIG. 5A was described with reference to FIGS. 4A and 4B above, the present invention is not limited to this example. As another example, a discharge time timer built into the power supply control IC described in Non-Patent Document 1 and used to discharge the Xcap (as an additional feature of the power supply control IC) can be configured in a two-stage configuration, for example, where the first-stage timer output is fed through the PGS terminal illustrated in FIGS. 1 and 2 as the AC detection signal (PGS output) and used for the reset signal 41 illustrated in FIG. 4A. Meanwhile, the second-stage timer output can be used as the input for the Xcap discharge circuit in the same manner as described above.

Furthermore, it is preferable that the count time of the counter 43 illustrated in FIGS. 4A and 5A be set to approximately ½ of the period T of the AC voltage. This is because if too short of a time is set, the proportion of time the AC detection signal spends at the H level becomes too small, and it becomes difficult to maintain the output of the EN signal conversion circuit at a value equal to or greater than the enable threshold value, even when the AC detection signal is output repeatedly.

FIG. 6 illustrates an example configuration of the EN signal conversion circuit according to the present disclosure. That is, when the AC detection signal (40, 45) output from the AC detection circuits illustrated FIGS. 3A and 4A takes the H level, the switch 111 illustrated in FIG. 6 closes, and the capacitor C61 in the delay circuit 112 in FIG. 6 is rapidly charged by a voltage VDD. Moreover, the voltage of the charged capacitor C61 is output from the EN signal conversion circuit 11 as the DC/DC EN signal 113. Furthermore, when the AC detection signal (40, 45) takes the L level, the switch 111 illustrated in FIG. 6 opens, and the terminal voltage of the capacitor C61 decreases in accordance with the time constant of the resistor R61 and the capacitor C61.

The EN signal conversion circuit 11 is a type of filter circuit for the AC detection signal, and as long as the rectangular wave corresponding to detection of rises in the VH terminal voltage continues to be input, the DC/DC EN signal 113 (the terminal voltage of the capacitor C61) is maintained to be greater than or equal to the enable threshold value because the capacitor C61 gets recharged before the signal falls below that enable threshold value (see FIG. 7A).

When the AC input is cut off, the rectangular wave corresponding to detection of rises in the VH terminal voltage is no longer input to the EN signal conversion circuit 11, and as a result, the output of the EN signal conversion circuit 11 falls below the enable threshold value, and it is detected that the AC has been cut off (see FIG. 7A).

This DC/DC EN signal 113 is applied to an enable control (EN) terminal of the DC/DC converter 12 illustrated in FIGS. 1 and 2 and internally compared to the enable threshold value in the DC/DC converter 12. If determined to be at the H level, the DC/DC converter 12 begins controlling a switching operation. Moreover, if the DC/DC EN signal 113 is determined to be at the L level, the DC/DC converter 12 stops the switching operation, and the microcomputer 14 or the like begins consuming charge from an output capacitor of the DC/DC converter 12 (not illustrated in the figures), thereby causing the output voltage of the DC/DC converter 12 to gradually decrease.

The output voltage (DC/DC output) of the DC/DC converter 12 illustrated in FIG. 2 is supplied to the microcomputer 14. Meanwhile, in addition to receiving the power supplied from the DC/DC converter 12, the microcomputer 14 also monitors the output voltage of the DC/DC converter 12. When the DC/DC EN signal falls below the enable threshold value and thereby causes the output voltage of the DC/DC converter 12 to decrease, the microcomputer 14 detects this decrease in the output voltage, and the microcomputer 14 outputs the data storage signal to the data storage circuit 15, thereby causing channel settings information, audio settings information, and the like to be saved to memory in the data storage circuit 15. Doing this makes it possible to detect upcoming decreases in the power supply output 8 on the output side of the AC/DC converter according to the present disclosure earlier than in conventional technologies, thereby making it possible to easily protect the secondary-side load system. Moreover, this, in turn, makes it possible to allocate data writing time or the necessary reset time when shutting down the power supply system.

Figure 7A:
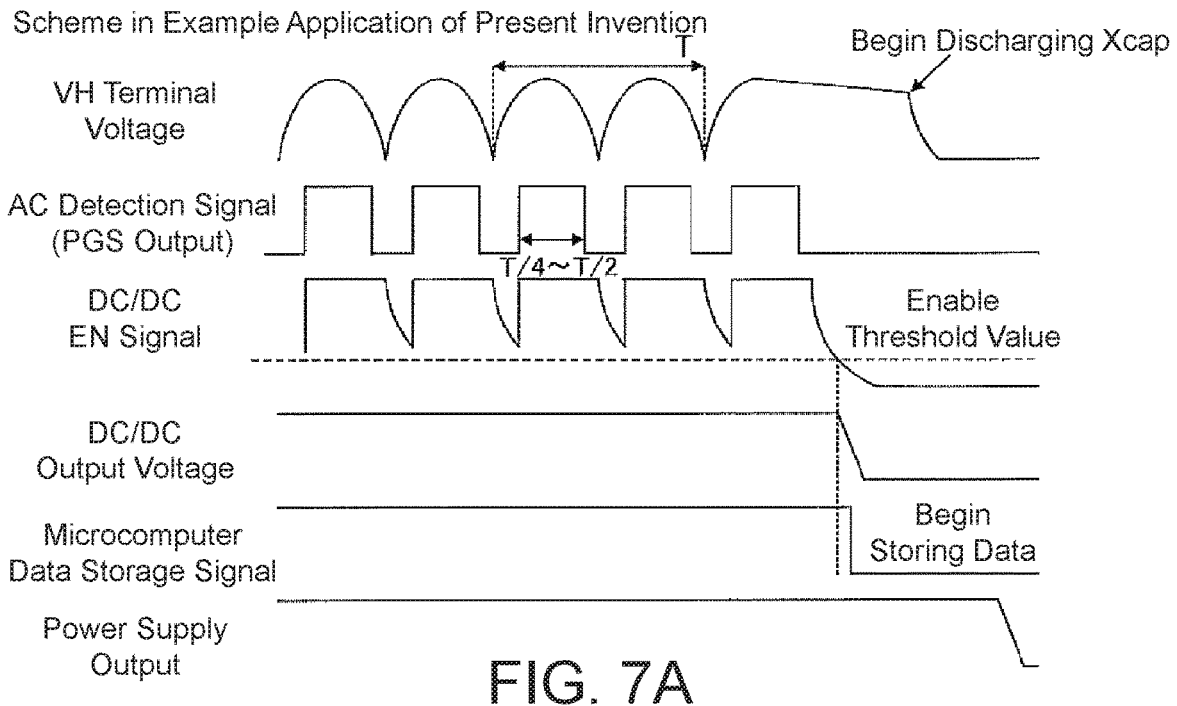
FIG. 7A illustrates a control scheme implemented in the power supply control IC according to the present disclosure.
Figure 7B:
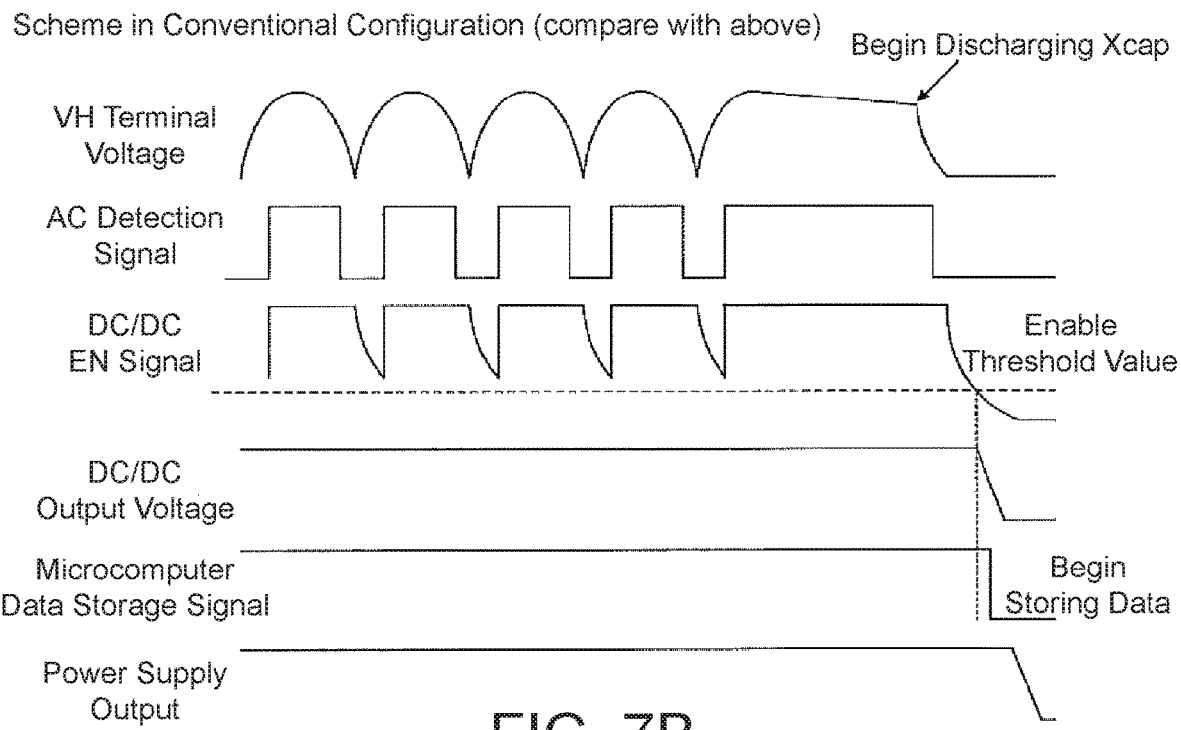
FIG. 7B illustrates a waveform diagram for a conventional configuration.
Figure 8:
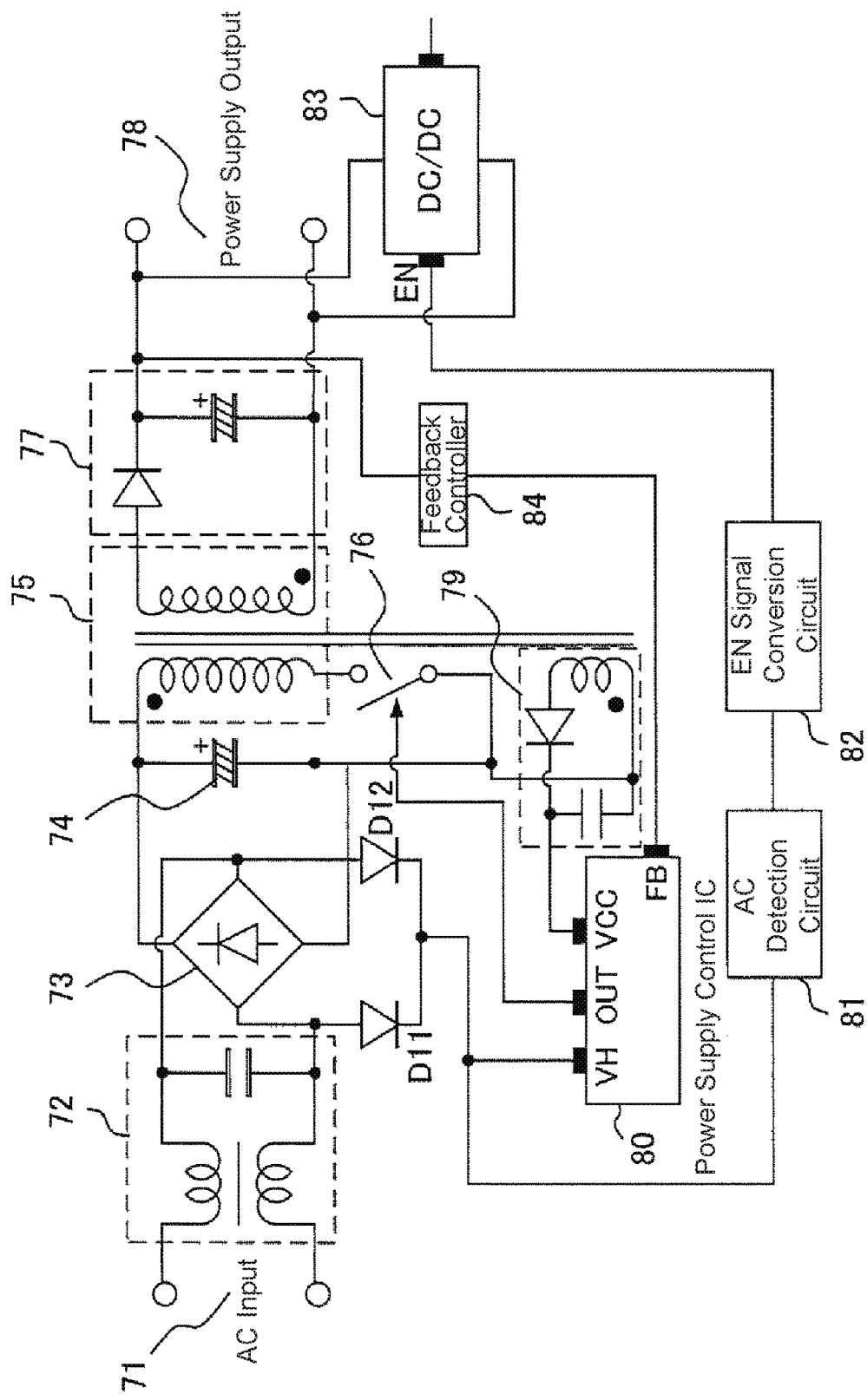
FIG. 8 illustrates an example configuration of a conventional AC/DC converter.
Figure 9:
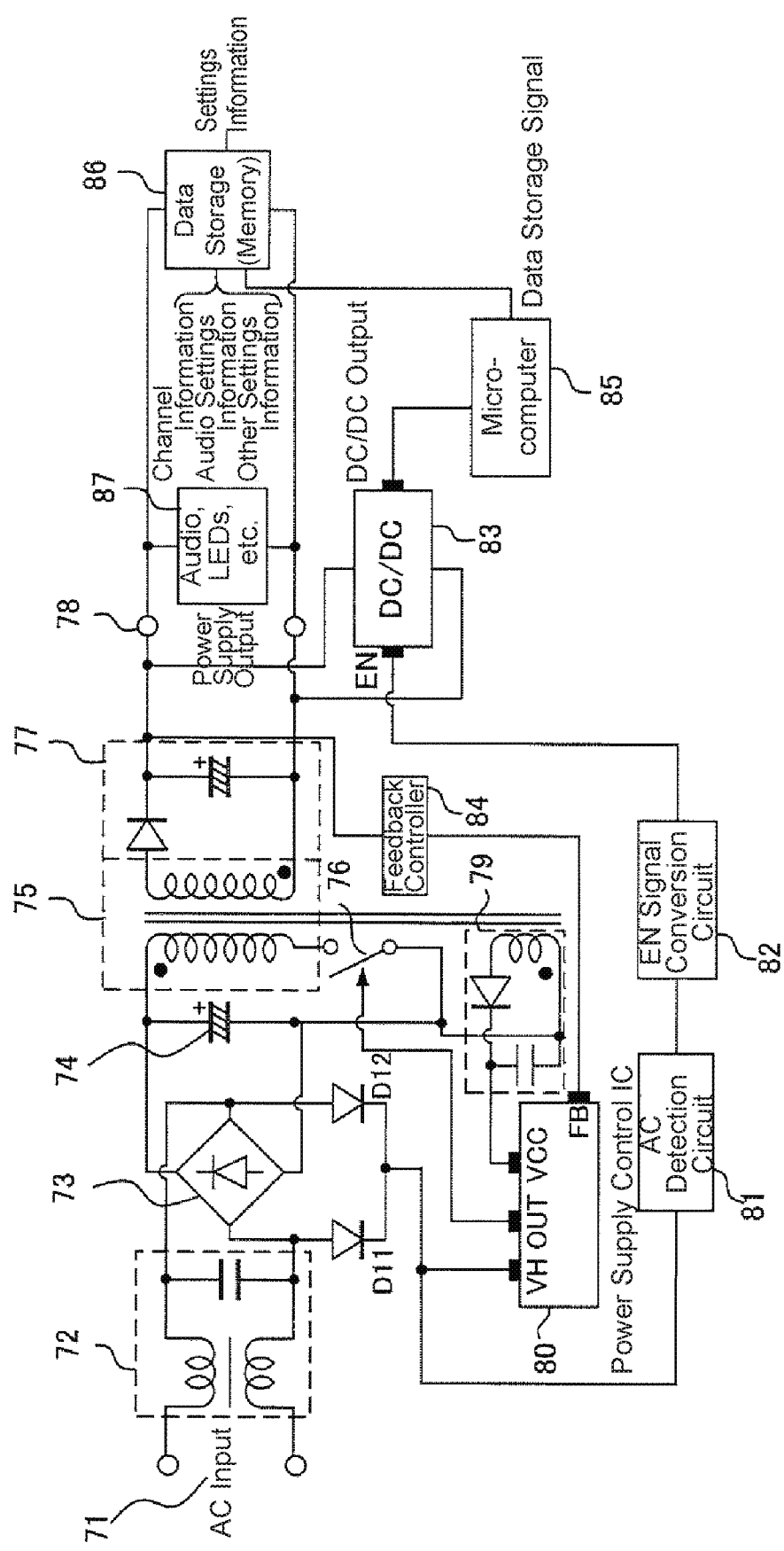
FIG. 9 illustrates an example of a specific application of the conventional AC/DC converter illustrated in FIG. 8.

FIGS. 7A and 7B illustrate the control scheme implemented in the power supply control IC according to the present disclosure. In other words, FIG. 7A is a waveform diagram for the control scheme of the present disclosure, while FIG. 7B is a waveform diagram for a conventional configuration. FIGS. 7A and 7B are aligned vertically for comparison purposes for a case in which the AC input voltage is cut off after a period of 2 T has elapsed from the point in time at the left edge of the figures.

In both FIG. 7A and FIG. 7B, the VH terminal voltage begins decreasing gradually after a period of 2 T has elapsed. Here, the VH terminal voltage after the AC input voltage is cut off is the voltage originating from the terminal voltage of the X capacitor 21, and the initial value of the terminal voltage of the X capacitor 21 after cutoff is equal to the value of the AC input voltage immediately prior to being cut off. Moreover, FIGS. 7A and 7B illustrate an example in which the AC input voltage is cut off while at a relatively high value. In FIG. 7A, it is possible to detect the termination of the AC detection signal (PGS output) (that is, the cutoff of the AC input voltage) earlier than in FIG. 7B, thereby making it possible to successfully perform processes such as saving data from the load system immediately after the DC/DC EN signal falls below the enable threshold value.

In contrast, in FIG. 7B, the AC detection signal remains at the H level and the DC/DC EN signal does not decrease until the X capacitor 21 begins discharging. As a result, the cutoff of the AC input voltage is detected at a later time than in FIG. 7A, and therefore there is no extra time margin for processes such as saving data from the load system.

Figure 10:
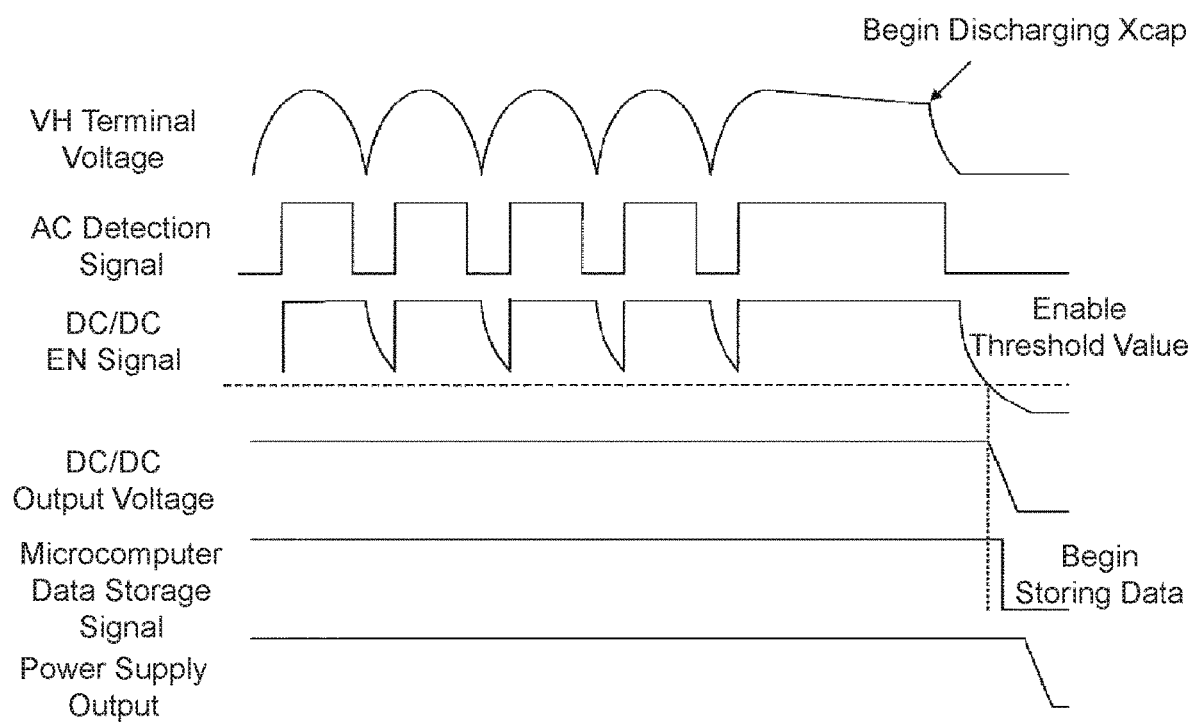
FIG. 10 illustrates a control scheme based on the output of an AC detection circuit in the conventional configuration illustrated in FIG. 9.

Note that although the waveform diagram illustrated in FIG. 7B is the same as the waveform diagram illustrated in FIG. 10, FIG. 10 is only for explaining the operation of a conventional configuration and is not intended to be compared with the waveforms in the control scheme of the present disclosure.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A control circuit for an AC/DC converter that converts an AC input voltage to DC power output and supplies the DC power output to a load system, the load system being configured to receive an enable signal for enabling and disabling operations of the load system, the load system being operated when the enable signal is in a HIGH state, the load system being shut down when the enable signal is in a LOW state, the control circuit comprising:
an AC detection circuit that periodically determines from a change in the AC input voltage whether AC voltage is being input and, upon determining that AC voltage is being input, outputs an AC detection signal that takes a HIGH level only for a prescribed duration; and
an enable signal conversion circuit that filters the AC detection signal to generate the enable signal that is in the HIGH state when the AC detection signal is in the HIGH level and that becomes the LOW state after a prescribed time has passed since the AC detection signal becomes a LOW level unless the AC detection signal rises to the HIGH level again,
wherein the enable signal conversion circuit outputs the enable signal to the load system to which the DC power output of the AC/DC converter is supplied.

2. The control circuit for the AC/DC converter according to claim 1, wherein a HIGH level period of the prescribed duration for the AC detection signal is set by a timer, and a starting time of the HIGH level period is set in accordance with detection of a rise in the AC input voltage.

3. The control circuit for the AC/DC converter according to claim 2, wherein the HIGH level period of the prescribed duration for the AC detection signal is set to ¼ to ½ of a period of the AC input voltage.

4. The control circuit for the AC/DC converter according to claim 2, further comprising:
a discharge control timer for controlling discharge of an X capacitor connected to an input unit for the AC input voltage,
wherein the discharge control timer is reset by the AC detection signal, and when the discharge control timer finishes counting, an instruction to discharge the X capacitor is sent.

5. The control circuit for the AC/DC converter according claim 1, wherein the AC detection circuit includes:
a comparator that compares an AC representative voltage derived from the AC input voltage with a prescribed reference voltage;
a counter that takes as input a reset signal generated when the AC representative voltage falls below the prescribed reference voltage and then begins a counting operation upon the reset signal being cleared when the AC representative voltage becomes greater than the prescribed reference voltage;
a pulse generator that generates a single pulse when the AC representative voltage becomes greater than the prescribed reference voltage; and
a flip-flop having a set terminal to which a pulse output from the pulse generator,
wherein the flip-flop is reset when the AC representative voltage falls below the prescribed reference voltage or when the counter finishes counting, and
wherein an output of the flip-flop is used as the AC detection signal.

6. The control circuit for the AC/DC converter according to claim 5, wherein the AC representative voltage is a divided voltage of a voltage that obtained by half-wave rectifying the AC input voltage.

7. The control circuit for the AC/DC converter according claim 1,
wherein the AC detection circuit includes:
a selection circuit that receives an upper reference voltage and a lower reference voltage and selectively outputs one of the upper reference voltage and the lower reference voltage as a selection circuit output;
a comparator that compares an AC representative voltage derived from the AC input voltage with the upper or lower reference voltage selected and outputted by the selection circuit;
a control logic unit that sends, to the selection circuit, an instruction indicating whether to select the upper reference voltage or the lower reference voltage, and, upon detecting that the AC representative voltage is greater than the upper reference voltage or lower than the lower reference voltage, changes the upper limit reference and the lower reference voltage that are received and selected by the selection circuit;
a reset signal generation unit that outputs a reset pulse when the AC representative voltage becomes greater than the upper reference voltage selected by the selection circuit; and
a counter that sets an output thereof to a HIGH level upon being reset by the reset pulse, starts counting when this reset is cleared, and sets the output to a LOW level upon counting to a prescribed count time, and
wherein the output of the counter is used as the AC detection signal.

8. The control circuit for the AC/DC converter according to claim 7, wherein the count time to which the counter counts is set to ¼ to ½ of a period of the AC input voltage.

9. The control circuit for the AC/DC converter according to claim 7, wherein the AC representative voltage is a divided voltage of a voltage that is obtained by half-wave rectifying the AC input voltage.

10. The control circuit for the AC/DC converter according to claim 1,
wherein the load system starts shutting down when the enable signal changes from the HIGH level to the LOW level, and
wherein after the load system starts shutting down due to the enable signal changing from the HIGH level to the LOW level, the control circuit causes an X capacitor connected to an input unit for the AC input voltage to begin discharging, the X capacitor being arranged between the input unit and a full wave rectifier circuit in the AC/DC converter.

11. A control circuit for an AC/DC converter that converts an AC input voltage to DC power output and supplies the DC power output to a load system, the control circuit comprising:
an AC detection circuit that periodically determines from a change in the AC input voltage whether AC voltage is being input and outputs an AC detection signal according to a result of a determination of the AC detection circuit; and
an enable signal generation circuit that generates an enable signal based on the AC detection signal,
wherein the enable signal generation circuit outputs the enable signal for enabling and disabling operations of the load system to the load system to which the DC power output of the AC/DC converter is supplied.

12. The control circuit for the AC/DC converter according to claim 11,
wherein the load system starts shutting down when the enable signal changes from an enable level to a disable level, and
wherein after the load system starts shutting down due to the enable signal changing from the enable level to the disable level, the control circuit causes an X capacitor connected to an input unit for the AC input voltage to begin discharging, the X capacitor being arranged between the input unit and a full wave rectifier circuit in the AD/DC converter.

13. The control circuit for the AC/DC converter according to claim 12,
wherein the AC/DC converter includes a transformer between the input unit and an output unit for the DC power output and a power switch controlling a current flowing in the transformer for converting the AC input voltage to the DC power output,
wherein the control circuit instructs a switching operation of the power switch when the enable signal is at the enable level,
wherein the control circuit instructs stopping the switching operation when the enable signal is at the disable level, and
wherein after the enable signal changes from the enable level to the disable level, after the load system begins shutting down, and after the control circuit instructs the stopping of the switching operation, the control circuit causes the X capacitor to begin discharging.

14. The control circuit for the AC/DC converter according to claim 12, wherein when the AC detection circuit determines that the AC voltage is being input, the AC detection circuit outputs the AC detection signal taking a predetermined level only for a prescribed duration, and wherein the enable signal generation circuit filters the AC detection signal so as to generate the enable signal.

15. The control circuit for the AC/DC converter according to claim 14, wherein the prescribed duration is set by a timer, and a starting time of the prescribed duration is set in accordance with detection of a rise in the AC input voltage.

16. The control circuit for the AC/DC converter according to claim 15, wherein the prescribed duration is set to ¼ to ½ of a period of the AC input voltage.

17. The control circuit for the AC/DC converter according claim 12, wherein the AC detection circuit includes:
a comparator that compares an AC representative voltage derived from the AC input voltage with a prescribed reference voltage;
a counter that takes as input a reset signal generated when the AC representative voltage falls below the prescribed reference voltage and then begins a counting operation upon the reset signal being cleared when the AC representative voltage becomes greater than the prescribed reference voltage;
a pulse generator that generates a single pulse when the AC representative voltage becomes greater than the prescribed reference voltage; and
a flip-flop having a set terminal to which a pulse output from the pulse generator,
wherein the flip-flop is reset when the AC representative voltage falls below the prescribed reference voltage or when the counter finishes counting, and
wherein an output of the flip-flop is used as the AC detection signal.

18. The control circuit for the AC/DC converter according to claim 17, wherein the AC representative voltage is a divided voltage of a voltage that obtained by half-wave rectifying the AC input voltage.

19. The control circuit for the AC/DC converter according claim 12, wherein the AC detection circuit includes:
a selection circuit that receives an upper reference voltage and a lower reference voltage and selectively outputs one of the upper reference voltage and the lower reference voltage as a selection circuit output;
a comparator that compares an AC representative voltage derived from the AC input voltage with the upper or lower reference voltage selected and outputted by the selection circuit;
a control logic unit that sends, to the selection circuit, an instruction indicating whether to select the upper reference voltage or the lower reference voltage, and, upon detecting that the AC representative voltage is greater than the upper reference voltage or lower than the lower reference voltage, changes the upper limit reference and the lower reference voltage that are received and selected by the selection circuit;
a reset signal generation unit that outputs a reset pulse when the AC representative voltage becomes greater than the upper reference voltage selected by the selection circuit; and a counter that sets an output thereof to a HIGH level upon being reset by the reset pulse, starts counting when this reset is cleared, and sets the output to a LOW level upon counting to a prescribed count time, and wherein the output of the counter is used as the AC detection signal.

20. The control circuit for the AC/DC converter according claim 12, wherein when the AC detection circuit detects that the AC input voltage is input, a signal level of the AC detection signal is changed every period of the AC input voltage, wherein when the AC detection circuit detects that the AC input voltage is interrupted, changing the signal level of the AC detection signal every period of the AC input voltage is stopped, and wherein the enable signal is changed from the enable level to the disable level when changing the signal level of the AC detection signal every period of the AC input voltage is stopped.

21. A control circuit for an AC/DC converter that converts an AC input voltage to DC power output and supplies the DC power output to a load system, the load system being configured to receive an enable signal from the control circuit for enabling and disabling operations of the load system, the control circuit comprising one or more circuits that perform the following:

when the AC input voltage is input, holding the enable signal to an enable level;

when the AC input voltage is interrupted, changing the enable signal from the enable level to a disable level, thereby causing the load system to begin shutting down;

after the enable signal changes from the enable level to the disable level and the load system begins shutting down, causing an X capacitor connected to an input unit for the AC input voltage to begin discharging, the X capacitor being arranged between the input unit and a full wave rectifier circuit in the AD/DC converter.

22. The control circuit for the AC/DC converter according to claim 21, wherein the AC/DC converter includes a transformer between the input unit and an output unit for the DC power output and a power switch controlling a current flowing in the transformer for converting the AC input voltage to the DC power output, wherein the control circuit instructs a switching operation of the power switch when the enable signal is in the enable level, wherein the control circuit instructs stopping the switching operation when the enable signal is in the disable level, and wherein after the enable signal changes from the enable level to the disable level, after the load system begins shutting down, and after the control circuit instructs the stopping of the switching operation, the control circuit causes the X capacitor to begin discharging.

* * * * *